(12) United States Patent
Shiokawa

(10) Patent No.: US 11,264,071 B2
(45) Date of Patent: Mar. 1, 2022

(54) MAGNETORESISTANCE EFFECT ELEMENT AND MAGNETIC MEMORY

(71) Applicant: TDK CORPORATION, Tokyo (JP)

(72) Inventor: Yohei Shiokawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/912,832

(22) Filed: Jun. 26, 2020

(65) Prior Publication Data
US 2021/0020216 A1 Jan. 21, 2021

(30) Foreign Application Priority Data
Jul. 19, 2019 (JP) .............................. JP2019-133796

(51) Int. Cl.
*G11C 11/00* (2006.01)
*G11C 11/16* (2006.01)
(Continued)

(52) U.S. Cl.
CPC .......... *G11C 11/161* (2013.01); *G01R 33/093* (2013.01); *H01L 27/222* (2013.01);
(Continued)

(58) Field of Classification Search
CPC ....... G11C 11/161; H01L 43/08; H01L 43/10; H01L 43/04; H01L 27/222
See application file for complete search history.

(56) References Cited

U.S. PATENT DOCUMENTS

| 8,350,347 B2 | 1/2013 | Gaudin et al. |
| 2014/0056060 A1 | 2/2014 | Khvalkovskiy et al. |

(Continued)

FOREIGN PATENT DOCUMENTS

| JP | 2014-045196 A | 3/2014 |
| WO | 2016/021468 A1 | 2/2016 |
| WO | 2016/159017 A1 | 10/2016 |

OTHER PUBLICATIONS

Fukami, S. et al., "A Spin-Orbit Torque Switching Scheme With Collinear Magnetic Easy Axis and Current Configuration," Nature Nanotechnology, Mar. 21, 2016, pp. 1-6.
(Continued)

*Primary Examiner* — Toan K Le
(74) *Attorney, Agent, or Firm* — Oliff PLC

(57) ABSTRACT

A magnetoresistance effect element where asymmetry of an inversion current due to a leakage magnetic field from a magnetization fixed layer is decreased. A magnetoresistance effect element includes a first ferromagnetic layer whose magnetization direction is variable, a second ferromagnetic layer whose magnetization direction is fixed, and a nonmagnetic layer sandwiched between the first ferromagnetic layer and the second ferromagnetic layer which are laminated in a first direction which is a lamination direction, where both the first ferromagnetic layer and the second ferromagnetic layer are curved so that central portions of the first and second ferromagnetic layers protrude with respect to outer circumferential portions in the first direction, and protruding directions of the central portions are opposite to each other so that a distance between the outer circumferential portions is larger than a distance between the central portions in the first direction.

14 Claims, 6 Drawing Sheets

(51) Int. Cl.
    H01L 43/08    (2006.01)
    G01R 33/09    (2006.01)
    H01L 43/04    (2006.01)
    H01L 27/22    (2006.01)
    H01L 43/10    (2006.01)

(52) U.S. Cl.
    CPC .............. *H01L 43/04* (2013.01); *H01L 43/08* (2013.01); *H01L 43/10* (2013.01)

(56) References Cited

U.S. PATENT DOCUMENTS

| | | |
|---|---|---|
| 2014/0252439 A1 | 9/2014 | Guo |
| 2014/0312441 A1 | 10/2014 | Guo |
| 2015/0036415 A1 | 2/2015 | Di Pendina et al. |
| 2015/0348606 A1 | 12/2015 | Buhrman et al. |
| 2017/0222135 A1 | 8/2017 | Fukami et al. |
| 2018/0040357 A1* | 2/2018 | Shirotori ............. G11C 11/1675 |
| 2019/0206431 A1* | 7/2019 | Sasaki .................... H01L 43/02 |
| 2019/0287589 A1* | 9/2019 | Buyandalai ........... H01L 27/228 |

OTHER PUBLICATIONS

Kato, Y.K. et al., "Observation of the Spin Hall Effect in Semiconductors," Science, vol. 306, Dec. 10, 2004, pp. 1910-1913.

Miron, I.M. et al., "Perpendicular Switching of a Single Ferromagnetic Layer Induced by In-Plane Current Injection," Nature, vol. 476, Aug. 11, 2011, pp. 189-194.

Liu, L. et al., "Spin Torque Switching With The Giant Spin Hall Effect of Tantalum," Science, vol. 336, 2012 (32 pages).

Liu, L. et al., "Current-Induced Switching of Perpendicularly Magnetized Magnetic Layers Using Spin Torque from the Spin Hall Effect," Physical Review Letters, vol. 109, Aug. 31, 2012, pp. 096602-1 to 096602-5.

Lee, K. et al., "Threshold Current for Switching of a Perpendicular Magnetic Layer Induced By Spin Hall Effect," Applied Physics Letters, vol. 102, 2013, pp. 1-17.

Lee, K et al., "Thermally Activated Switching of Perpendicular Magnet By Spin-Orbit Spin Torque," Applied Physics Letters, vol. 104, 2014, pp. 072413-1 to 072413-5.

Fukami, S. et al., "Magnetization Switching By Spin-Orbit Torque in an Antiferromagnet-Ferromagnet Bilayer System," Nature Materials, Feb. 15, 2016, pp. 535-542.

Takahashi, S. et al., "Spin Injection and Detection in Magnetic Nanostructures," Physical Review B, vol. 67, 2003, pp. 052409-1 to 052409-4.

Seo, Y. et al., "Area-Efficient SOT-MRAM With a Schottky Diode," IEEE Electron Device Letters, vol. 37, No. 8, Aug. 2016, pp. 982-985.

Zhang, W. et al., "Spin Hall Effects in Metallic Antiferromagnets," Physical Review Letters, vol. 113, Nov. 7, 2014, pp. 196602-1 to 196602-6.

* cited by examiner

MAGNETORESISTANCE EFFECT ELEMENT AND MAGNETIC MEMORY

BACKGROUND OF THE INVENTION

Field of the Invention

The present disclosure relates to a magnetoresistance effect element and a magnetic memory.

Priority is claimed on Japanese Patent Application No. 2019-133796, filed Jul. 19, 2019, the content of which is incorporated herein by reference.

Description of Related Art

A giant magnetoresistance (GMR) element formed of a multilayer film including a ferromagnetic layer and a nonmagnetic layer, and a tunnel magnetoresistance (TMR) element in which an insulating layer (a tunnel barrier layer, a barrier layer) is used as a nonmagnetic layer are known. Generally, although a TMR element has a higher element resistance compared to a GMR element, a magnetoresistance (MR) ratio of a TMR element is larger than an MR ratio of a GMR element. Therefore, attention has been focused on a TMR element as an element for magnetic sensors, high frequency components, magnetic heads, and non-volatile random access memories (MRAMs).

In an MRAM, data is read and written by utilizing characteristics in which element resistance of a TMR element changes as magnetization directions of two ferromagnetic layers sandwiching an insulating layer change. As a writing method of MRAMs, a method of performing writing (magnetization reversal) by utilizing a magnetic field generated by a current, and a method of performing writing (magnetization reversal) by utilizing a spin transfer torque (STT) generated by causing a current to flow in a lamination direction of a magnetoresistance element are known. Although magnetization reversal of a TMR element using an STT is efficient when considered from the viewpoint of energy efficiency, an inversion current density required to cause magnetization reversal is high. From the viewpoint of prolonging a service life of TMR elements, it is preferable that the inversion current density be low. The same applies to GMR elements.

Therefore, in recent years, attention has been focused on a magnetization reversal utilizing a pure spin current generated by a spin Hall effect as a method for reducing an inversion current using a mechanism different from the STT (for example, Non-Patent Document 1). A pure spin current generated by a spin Hall effect induces a spin-orbit torque (SOT), and the SOT causes magnetization reversal to occur. Alternatively, even with a pure spin current generated by an interface Rashba effect at an interface between different materials, the same SOT causes magnetization reversal to occur. A pure spin current is generated when the same number of upward spin electrons and downward spin electrons flow in opposite directions to each other and flows of electrical charge cancel each other out. Therefore, a current flowing through a magnetoresistance effect element is zero, and realization of a magnetoresistance effect element with a small inversion current density can be expected.

A spin Hall effect depends on a magnitude of spin-orbit interaction. In Non-Patent Document 1, Ta, which is a heavy metal having d-electrons that cause spin-orbit interaction, is used in the spin-orbit torque wiring. It is also known that in GaAs, which is a semiconductor, a spin-orbit interaction occurs due to an electric field inside a crystal generated by breaking of inversion symmetry with time.

PATENT DOCUMENTS

[Non-Patent Document 1] S. Fukami, T. Anekawa, C. Zhang and H. Ohno, Nature Nano Tech (2016). DOI: 10.1038/NNANO.2016.29

SUMMARY OF THE INVENTION

In a spin-orbit torque (SOT) type magnetoresistance effect element, magnetization reversal behavior of a magnetization free layer (free layer) changes due to a magnetic field.

FIG. 8 illustrates a schematic cross-sectional view of a typical magnetoresistance effect element 100. The magnetoresistance effect element 100 includes a magnetization fixed layer (pinned layer) 101, a magnetization free layer 102, and a nonmagnetic layer 103 sandwiched therebetween. A magnetic field received by the magnetization free layer 102 also includes a leakage magnetic field BL from an end portion 101a of the magnetization fixed layer 101, and asymmetric magnetization reversal behavior is exhibited by an inversion current when magnetization is reversed from parallel to antiparallel and an inversion current when magnetization is reversed from antiparallel to parallel due to the influence of the leakage magnetic field BL.

The present disclosure has been made in view of the above problems and it is an objective of the present disclosure to provide a magnetoresistance effect element and a magnetic memory in which symmetry of an inversion current due to a leakage magnetic field from a magnetization fixed layer is improved.

The present disclosure provides the following means in order to solve the above problems.

(1) A magnetoresistance effect element according to a first aspect of the present disclosure includes a first ferromagnetic layer whose magnetization direction is variable, a second ferromagnetic layer whose magnetization direction is fixed, and a nonmagnetic layer sandwiched between the first ferromagnetic layer and the second ferromagnetic layer which are laminated in a first direction, in which both the first ferromagnetic layer and the second ferromagnetic layer are curved so that central portions thereof protrude with respect to outer circumferential portions in the first direction, and protruding directions of the central portions are opposite to each other so that a distance between the outer circumferential portions of them is larger than a distance between the central portions of them in the first direction.

(2) A magnetoresistance effect element according to a second aspect of the present disclosure includes a first ferromagnetic layer whose magnetization direction is variable, a second ferromagnetic layer whose magnetization direction is fixed, and a nonmagnetic layer sandwiched between the first ferromagnetic layer and the second ferromagnetic layer, which are laminated in a first direction, in which both the first ferromagnetic layer and the second ferromagnetic layer are formed so that a cross-sectional area of a cross section perpendicular to the first direction increases as a distance from the nonmagnetic layer increases in the first direction.

(3) A magnetoresistance effect element according to a third aspect of the present disclosure includes a first ferromagnetic layer, a second ferromagnetic layer, and a nonmagnetic layer formed between the first ferromagnetic layer and the second ferromagnetic layer, in which at least a first distance, a second distance larger than the first distance, and a third distance larger than the first distance are present as a distance between the first ferromagnetic layer and the second ferromagnetic layer in the first direction in which the first ferromagnetic layer, the nonmagnetic layer, and the second ferromagnetic layer are aligned.

(4) In the magnetoresistance effect element according to the aspect (3) described above, a position having the first distance may be sandwiched between a position having the second distance and a position having the third distance when viewed from a second direction perpendicular to the first direction.

(5) In the aspects described above, a film thickness of the first ferromagnetic layer may be smaller than a film thickness of the second ferromagnetic layer.

(6) In the aspects described above, the nonmagnetic layer may include a NaCl structure.

(7) In the aspects described above, the nonmagnetic layer may include a spinel structure or an inverse spinel structure.

(8) The aspects described above may further include a spin orbit torque wiring extending in the second direction intersecting the first direction and joined to the first ferromagnetic layer.

(9) A magnetic memory according to a third aspect of the present disclosure includes a plurality of magnetoresistance effect elements according to the first aspect or a plurality of magnetoresistance effect elements according to the second aspect.

According to the magnetoresistance effect element of the present disclosure, it is possible to provide a magnetoresistance effect element in which symmetry of an inversion current due to a leakage magnetic field from the magnetization fixed layer is improved.

DETAILED DESCRIPTION OF THE INVENTION

Figure 1A:
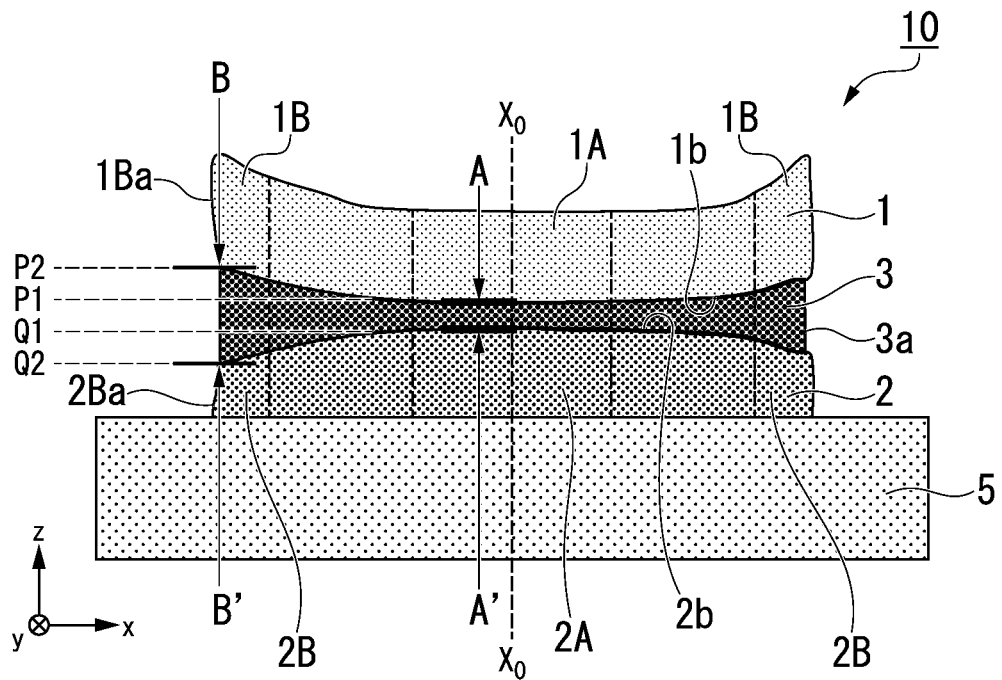
FIG. 1A is a schematic cross-sectional view of a magnetoresistance effect element according to a first embodiment of the present disclosure.

Hereinafter, the present embodiment will be described in detail with reference to the drawings as appropriate. In the drawings used in the following description, there are cases in which characteristic portions are appropriately enlarged for convenience of illustration so that characteristics of the present disclosure can be easily understood, and dimensional proportions of respective constituent elements may be different from actual ones. Materials, dimensions, and the like illustrated in the following description are merely examples, and the present disclosure is not limited thereto and can be implemented with appropriate modifications within a range in which the effects of the present disclosure are achieved.

Magnetoresistance Effect Element

First Embodiment

Figure 1B:
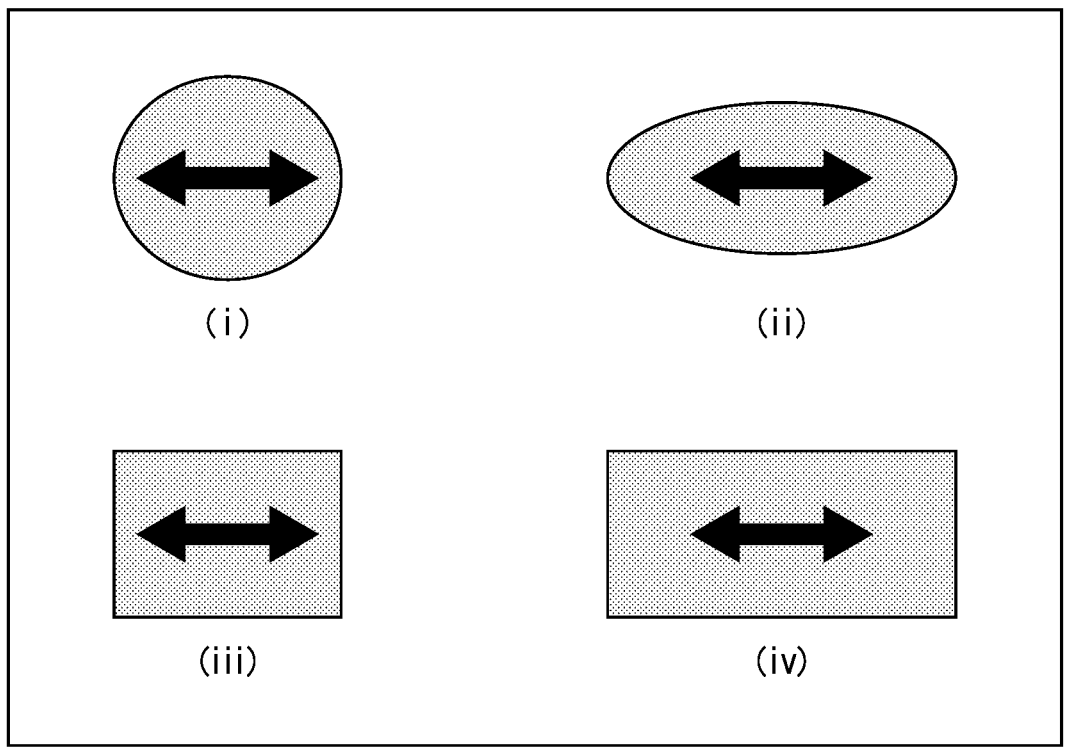
FIG. 1B is a schematic plan view of four examples of a laminate including a first ferromagnetic layer, a nonmagnetic layer, and a second ferromagnetic layer.
Figure 2:
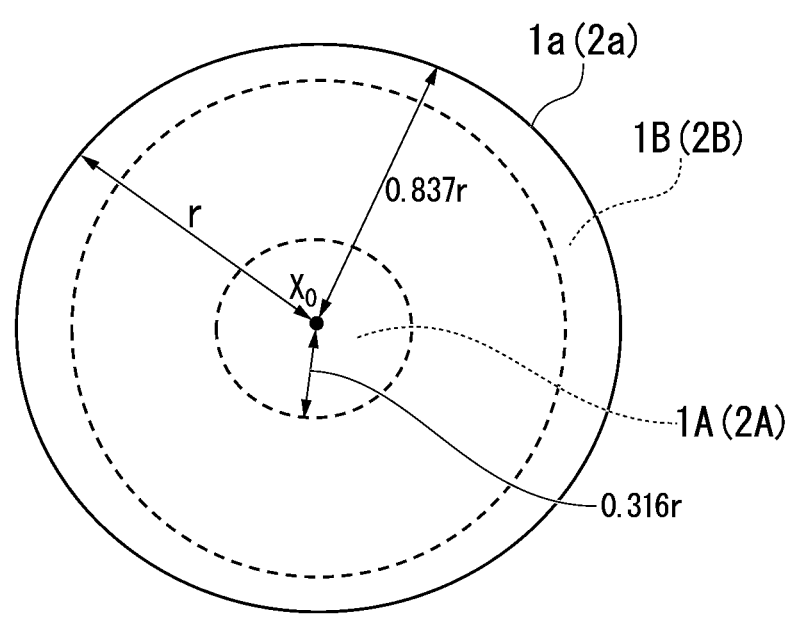
FIG. 2 is a schematic plan view of the first ferromagnetic layer or the second ferromagnetic layer.

FIG. 1A is a schematic cross-sectional view of a magnetoresistance effect element according to a first embodiment of the present disclosure, and FIG. 1B is a schematic plan view of four examples of a laminate including a first ferromagnetic layer, a nonmagnetic layer, and a second ferromagnetic layer. In FIG. 1B, each of the arrows indicates an example of a direction of an axis of easy magnetization. Also, FIG. 2 is a schematic plan view of the first ferromagnetic layer or the second ferromagnetic layer, and for the sake of convenience, references of both the first ferromagnetic layer and the second ferromagnetic layer are denoted in the schematic plan view.

A magnetoresistance effect element 10 includes a first ferromagnetic layer 1, a second ferromagnetic layer 2, and a nonmagnetic layer 3 sandwiched between the first ferromagnetic layer 1 and the second ferromagnetic layer 2 which are laminated in a first direction (z direction) which is a lamination direction, both the first ferromagnetic layer 1 and the second ferromagnetic layer 2 are curved so that central portions 1A and 2A thereof protrude with respect to outer circumferential portions 1B and 2B in the first direction (z direction), and protruding directions of the central portions 1A and 2A are opposite to each other such that a distance between the outer circumferential portions 1B and 2B is larger than a distance between the central portions 1A and 2A in the first direction (z direction).

The magnetoresistance effect element 10 is an example in which a laminated structure including the first ferromagnetic layer 1, the nonmagnetic layer 3 and the second ferromagnetic layer 2 is provided on a substrate 5.

In addition to these layers, the magnetoresistance effect element 10 may have other layers such as a cap layer or an underlayer within a range in which the effects of the present disclosure are achieved.

Hereinafter, a lamination direction of the first ferromagnetic layer 1, the second ferromagnetic layer 2, and the nonmagnetic layer 3 is referred to as a z direction. In the example illustrated in FIG. 1, the z direction is also a direction perpendicular to a main surface of the substrate 5. Also, an in-plane direction perpendicular to the z direction is referred to as an xy in-plane direction, and the main surface of the substrate 5 is the xy in-plane direction. One direction in the xy in-plane is referred to as an x direction, and a direction perpendicular to the x direction in the xy in-plane is referred to as a y direction.

<First Ferromagnetic Layer and Second Ferromagnetic Layer>

The first ferromagnetic layer 1 and the second ferromagnetic layer 2 are magnetic materials. The first ferromagnetic layer 1 and the second ferromagnetic layer 2 each have a magnetization. The magnetoresistance effect element 10 outputs change in relative angle between a magnetization of the first ferromagnetic layer 1 and a magnetization of the second ferromagnetic layer 2 as change in resistance value.

The first ferromagnetic layer 1 and the second ferromagnetic layer 2 illustrated in FIG. 1 are in-plane magnetic films whose magnetizations are oriented in the in-plane direction of the xy plane, but may be perpendicular magnetization films whose magnetizations are oriented in the z direction.

A magnetization of the second ferromagnetic layer 2 does not easily move compared to a magnetization of the first ferromagnetic layer 1. When a predetermined external force is applied, a magnetization direction of the second ferromagnetic layer 2 does not change (is fixed) while a magnetization direction of the first ferromagnetic layer 1 changes. When the magnetization direction of the first ferromagnetic layer 1 changes with respect to the magnetization direction of the second ferromagnetic layer 2, a resistance value of the magnetoresistance effect element 10 changes. In this case, the second ferromagnetic layer 2 may be called a magnetization fixed layer, and the first ferromagnetic layer 1 may be called a magnetization free layer. Hereinafter, a case in which the first ferromagnetic layer 1 is the magnetization free layer and the second ferromagnetic layer 2 is the magnetization fixed layer will be described as an example.

The first ferromagnetic layer 1 is bent so that the central portion 1A protrudes in a −z direction in the z direction with respect to the outer circumferential portion 1A. Also, the second ferromagnetic layer 2 is bent so that the central portion 2A protrudes in a +z direction in the z direction with respect to the outer circumferential portion 2B.

That is, in regard to the first ferromagnetic layer 1 and the second ferromagnetic layer 2, protruding directions of the central portions 1A and 2A are opposite to each other. Therefore, the first ferromagnetic layer 1 and the second ferromagnetic layer 2 are configured such that the distance between the outer circumferential portions 1B and 2B is larger than the distance between the central portions 1A and 2A in the z direction.

The central portion and the outer circumferential portion of the first ferromagnetic layer or the second ferromagnetic layer will be described in detail with reference to FIGS. 1A, 1B and 2.

First, a center line $X_0$-$X_0$ is a line parallel to the z direction passing through centers of the first ferromagnetic layer and the second ferromagnetic layer. "A center of the first ferromagnetic layer or a center of the second ferromagnetic layer" indicates a center of a circle in a case of a circle as illustrated in FIG. 1B(i), an intersection point of a minor axis and a major axis in a case of an ellipse as illustrated in FIG. 1B(ii), and an intersection point of diagonal lines in a case of a tetragon such as a square or a rectangle as illustrated in FIG. 1B(iii) or 1B(iv).

In the present specification, "center portion" indicates a portion obtained by sweeping a similar shape to an outer circumference 1a or 2a of the first ferromagnetic layer 1 or the second ferromagnetic layer 2 with an area ratio of 1/10 with the center line $X_0$-$X_0$ as a center in the z direction in a plan view from a +z side to a −z side. For example, in a case of a circle having a radius r in a plan view (see FIG. 2), a circle having a similar shape thereto with an area ratio of 1/10 is a circle having a radius of about 0.316r with the center line $X_0$-$X_0$ as a center.

Also, in the present specification, "outer circumferential portion" indicates a portion obtained by sweeping a remaining region after excluding a similar shape to the outer circumference 1a or 2a of the first ferromagnetic layer 1 or the second ferromagnetic layer 2 with an area ratio of 7/10 with the center line $X_0$-$X_0$ as a center from a planar shape of the ferromagnetic layer in the z direction in a plan view from the +z side to the −z side. For example, in a case of a circle having a radius r in a plan view (see FIG. 2), a circle having a similar shape thereto with an area ratio of 7/10 is a circle having a radius of about 0.837r with the center line $X_0$-$X_0$ as a center, and an outer circumferential portion is a remaining region after excluding the circle with the radius of 0.837r from the planar shape of the ferromagnetic layer.

In the magnetoresistance effect element 10, a distance (distance between lines indicated by arrows B and B') between the outer circumferential portion 1B of the first ferromagnetic layer 1 and the outer circumferential portion 2B of the second ferromagnetic layer 2 in the z direction is large compared to a distance (distance between lines indicated by arrows A and A') between the central portion 1A of the first ferromagnetic layer 1 and the central portion 2A of the second ferromagnetic layer 2 in the z direction. "Distance between the first ferromagnetic layer 1 and the second ferromagnetic layer 2" indicates a distance between a lower surface 1b of the first ferromagnetic layer 1 and an upper surface 2b of the second ferromagnetic layer 2 in the z direction. For example, "distance between the central portion 1A of the first ferromagnetic layer 1 and the central portion 2A of the second ferromagnetic layer 2" indicates a distance between the lower surface 1b at the central portion 1A of the first ferromagnetic layer 1 and the upper surface 2b at the central portion 2A of the second ferromagnetic layer 2 in the z direction.

Further, when determining a distance between the outer circumferential portions of them in the z direction an arbitrary point on the lower surface (surface facing the second ferromagnetic layer 2) 1b of the outer circumferential portion 1B of the first ferromagnetic layer 1 and an arbitrary point on the upper surface (surface facing the first ferromagnetic layer 1) 2b of the outer circumferential portion 2B of the second ferromagnetic layer 2 can be selected. In the example illustrated in FIG. 1, a distance between an intersection point P2 of the lower surface 1b of the outer circumferential portion 1B of the first ferromagnetic layer 1 with a lateral side surface 1Ba and an intersection point Q2 of the upper surface 2b of the outer circumferential portion 2B of the second ferromagnetic layer 2 with a lateral side surface 2Ba is a distance between the outer circumferential portions of them in the z direction. Similarly, when determining a distance between the central portions of them in the z direction an arbitrary point on the lower surface 1b of the central portion 1A of the first ferromagnetic layer 1 and an arbitrary point on the upper surface 2b of the central portion 2A of the second ferromagnetic layer 2 can be selected. In the example illustrated in FIG. 1, a distance between a point P1 on the lower surface 1b of the central portion 1A of the first ferromagnetic layer 1 in the vicinity of the center line $X_0$-$X_0$ and a point Q1 on the upper surface 2b of the central portion 2A of the second ferromagnetic layer 2 in the vicinity of the center line $X_0$-$X_0$ is a distance between the central portions of them in the z direction.

The magnetoresistance effect element 10 illustrated in FIG. 1 has a configuration in which the first ferromagnetic layer 1 and the second ferromagnetic layer 2 are both bent so that the central portions 1A and 2A protrude in the z direction with respect to the outer circumferential portions 1B and 2B, a protruding direction of the central portions 1A and 2A are opposite to each other, and a distance between the outer circumferential portions of them is large compared to a distance between the central portions of them. Therefore, compared to a configuration in which the first ferromagnetic layer and the second ferromagnetic layer are flat without being bent and a distance between the layers is uniform, that is, a configuration in which a distance between the outer circumferential portions of them is the same as a distance between the central portions of them, a leakage magnetic field entering the first ferromagnetic layer 1 serving as a magnetization free layer from the second ferromagnetic layer 2 serving as a magnetization fixed layer is reduced, and the symmetry of magnetization reversal of the first ferromagnetic layer 1 is improved accordingly.

Here, when the nonmagnetic layer is an insulating layer, in a configuration in which the first ferromagnetic layer and the second ferromagnetic layer which are flat without being bent is used, a leakage magnetic field entering the first ferromagnetic layer from the second ferromagnetic layer can be reduced by increasing an interlayer distance (thickness of the nonmagnetic layer), but a tunnel current flowing between the ferromagnetic layers exponentially decreases with respect to the interlayer distance (thickness of the nonmagnetic layer), and a sensitivity of the magnetoresistance effect element is greatly impaired. In contrast, the magnetoresistance effect element 10 has a configuration in which only a distance therebetween on the outer circumferential side is increased while a distance between the first ferromagnetic layer and the second ferromagnetic layer close to the center portion remains small Therefore, a leakage magnetic field entering the first ferromagnetic layer from the second ferromagnetic layer can be reduced and improvement in the symmetry of magnetization reversal of the first ferromagnetic layer can be achieved while as much sensitivity of the magnetoresistance effect element is maintained as possible.

In the magnetoresistance effect element according to the first embodiment, as a distance between the first ferromagnetic layer and the second ferromagnetic layer, there are at least a first distance, a second distance larger than the first distance, and a third distance larger than the first distance. In other words, the magnetoresistance effect element according to the first embodiment has a configuration in which the first distance, the second distance larger than the first distance, and the third distance larger than the first distance are present. Further, "distance between the first ferromagnetic layer and the second ferromagnetic layer" indicates a distance between the lower surface $1b$ of the first ferromagnetic layer 1 and the upper surface $2b$ of the second ferromagnetic layer 2 in the z direction as described above.

Although various combinations of the first distance, the second distance, and the third distance having the above-described magnitude relation can be taken, an example thereof will be described with reference to FIG. 1.

For example, when the first distance is set as a distance between lines indicated by arrows A and A', the second distance is set as a distance between lines indicated by arrows B and B', and the third distance is set as a distance between the outer circumferential portion 1B of the first ferromagnetic layer 1 and the outer circumferential portion 2B of the second ferromagnetic layer 2 at a position on a side opposite to the line indicated by the arrows B and B' with the center line $X_0$-$X_0$ sandwiched therebetween, there are the first distance, the second distance larger than the first distance, and the third distance larger than the first distance. Alternatively, when the third distance is set as a distance from a portion between the central portion 1A and the outer circumferential portion 1B of the first ferromagnetic layer 1 to a portion between the central portion 2A and the outer circumferential portion 2B of the second ferromagnetic layer 2 at a position on a side opposite to the line indicated by the arrows B and B' with the center line $X_0$-$X_0$ sandwiched therebetween, the third distance also is of a combination of the magnitude relation between the distances.

In the case of this example, the position having the first distance is sandwiched between the position having the second distance and the position having the third distance when viewed from a second direction (y direction) perpendicular to the first direction.

A combination of the first distance, the second distance, and the third distance having the magnitude relation may be selected in a cross section passing through the center of the first ferromagnetic layer and the center of the second ferromagnetic layer. An example of this is to select a combination between the first distance, the second distance, and the third distance in the cross section illustrated in FIG. 1.

The first ferromagnetic layer 1 and the second ferromagnetic layer 2 contain a ferromagnetic material. The ferromagnetic material forming the first ferromagnetic layer 1 and the second ferromagnetic layer 2 may be, for example, a metal selected from the group consisting of Cr, Mn, Co, Fe, and Ni, an alloy containing one or more of these metals, or an alloy containing these metals and at least one element of B, C, and N. The first ferromagnetic layer 1 and the second ferromagnetic layer 2 may contain, for example, elemental Fe. The first ferromagnetic layer 1 and the second ferromagnetic layer 2 containing elemental Fe have high spin polarization, and a magnetoresistance (MR) ratio of the magnetoresistance effect element 10 is increased. The first ferromagnetic layer 1 and the second ferromagnetic layer 2 may be, for example, Fe, Co—Fe, Co—Fe—B, or Ni—Fe.

The first ferromagnetic layer 1 and the second ferromagnetic layer 2 may be a Heusler alloy. Heusler alloy is a half metal and has a high spin polarization. The Heusler alloy is an intermetallic compound having a chemical composition of XYZ or $X_2YZ$, in which X indicates a transition metal element of the Co, Fe, Ni, or Cu group, or a noble metal element in the periodic table, Y indicates a transition metal of the Mn, V, Cr, or Ti group, or types of the X element, and Z indicates a typical element from Group III to Group V. The Heusler alloy may be, for example, $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, or the like.

Film thicknesses of the first ferromagnetic layer 1 and the second ferromagnetic layer 2 may each be, for example, 3 nm or less. When the film thicknesses of the first ferromagnetic layer 1 and the second ferromagnetic layer 2 are small, interface magnetic anisotropy occurs at interfaces between the first ferromagnetic layer 1 and the second ferromagnetic layer 2, and the nonmagnetic layer 3, and magnetization directions of the first ferromagnetic layer 1 and the second ferromagnetic layer 2 are easily oriented in a direction perpendicular to lamination surfaces.

The film thickness of the first ferromagnetic layer 1 is preferably smaller than the film thickness of the second ferromagnetic layer 2. This is because the second ferromagnetic layer 2 is a magnetization fixed layer and thus requires strong magnetic anisotropy, and a thick film configuration is required to exhibit strong perpendicular magnetic anisotropy.

An antiferromagnetic layer may be provided on a surface of the second ferromagnetic layer 2 opposite to the nonmagnetic layer 3 via a spacer layer. The second ferromagnetic layer 2, the spacer layer, and the antiferromagnetic layer have a synthetic antiferromagnetic structure (SAF structure). The synthetic antiferromagnetic structure is formed of two magnetic layers sandwiching a nonmagnetic layer therebetween. When the second ferromagnetic layer 2 and the antiferromagnetic layer are antiferromagnetically coupled, a coercive force of the second ferromagnetic layer 2 becomes larger than that in a case without the antiferromagnetic layer. The antiferromagnetic layer may be, for example, IrMn, PtMn, or the like. The spacer layer may contain, for example, at least one selected from the group consisting of Ru, Ir, and Rh.

<Nonmagnetic Layer>

A known material can be used for the nonmagnetic layer 3. For example, when the nonmagnetic layer 3 is made of an insulator (in a case of a tunnel barrier layer), $Al_2O_3$, $SiO_2$, MgO, $MgAl_2O_4$, or the like can be used for the material. In addition to these materials, a material in which a part of Al, Si, and Mg is substituted with Zn, Be, or the like can also be used. Of these, since MgO and $MgAl_2O_4$ are materials that can realize coherent tunneling, spin can be efficiently injected. When the nonmagnetic layer 3 is made of a metal, Cu, Au, Ag, or the like can be used for the material. Further, when the nonmagnetic layer 3 is made of a semiconductor, Si, Ge, $CuInSe_2$, $CuGaSe_2$, $Cu(In, Ga)Se_2$, or the like can be used for the material.

The nonmagnetic layer 3 may be one having a NaCl structure. As an example of this, the above-described nonmagnetic layer made of MgO can be stated.

The nonmagnetic layer 3 may be one having a spinel structure or an inverse spinel structure. As an example of this, the above-described nonmagnetic layer made of $MgAl_2O_4$ can be stated.

In the magnetoresistance effect element 10 illustrated in FIG. 1, a lateral side surface 3a of the nonmagnetic layer 3 is substantially the same as a lateral side surface 1a of the first ferromagnetic layer 1 and a lateral side surface 2a of the second ferromagnetic layer 2 in a plan view from the first direction (z direction). In other words, in a plan view from the first direction (z direction), the entire nonmagnetic layer 3 overlaps the first ferromagnetic layer 1 and the second ferromagnetic layer 2. Alternatively, when the magnetoresistance effect element 10 has a columnar shape, a diameter of the nonmagnetic layer 3 is substantially the same as a diameter of the first ferromagnetic layer 1 and a diameter of the second ferromagnetic layer 2.

However, the nonmagnetic layer 3 may be configured such that it has a smaller size in an xy planar direction than the first ferromagnetic layer 1 and the second ferromagnetic layer 2 so that the nonmagnetic layer 3 fits within outer circumferences of the first ferromagnetic layer 1 and the second ferromagnetic layer 2 in a plan view from the first direction (z direction).

<Substrate>

The substrate 5 is preferably highly flat. In order to obtain a highly flat surface, for example, Si, AlTiC, or the like can be used as a material.

Second Embodiment

Figure 3A:
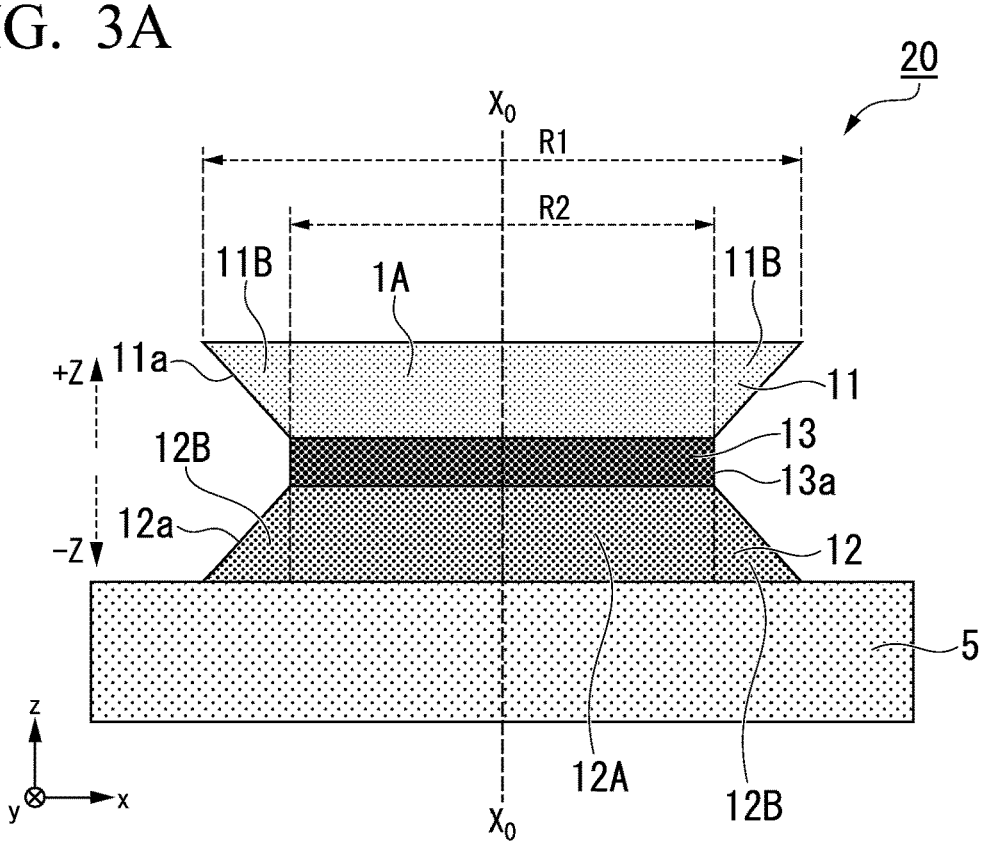
FIG. 3A is a schematic cross-sectional view of a magnetoresistance effect element according to a second embodiment of the present disclosure.
Figure 3B:
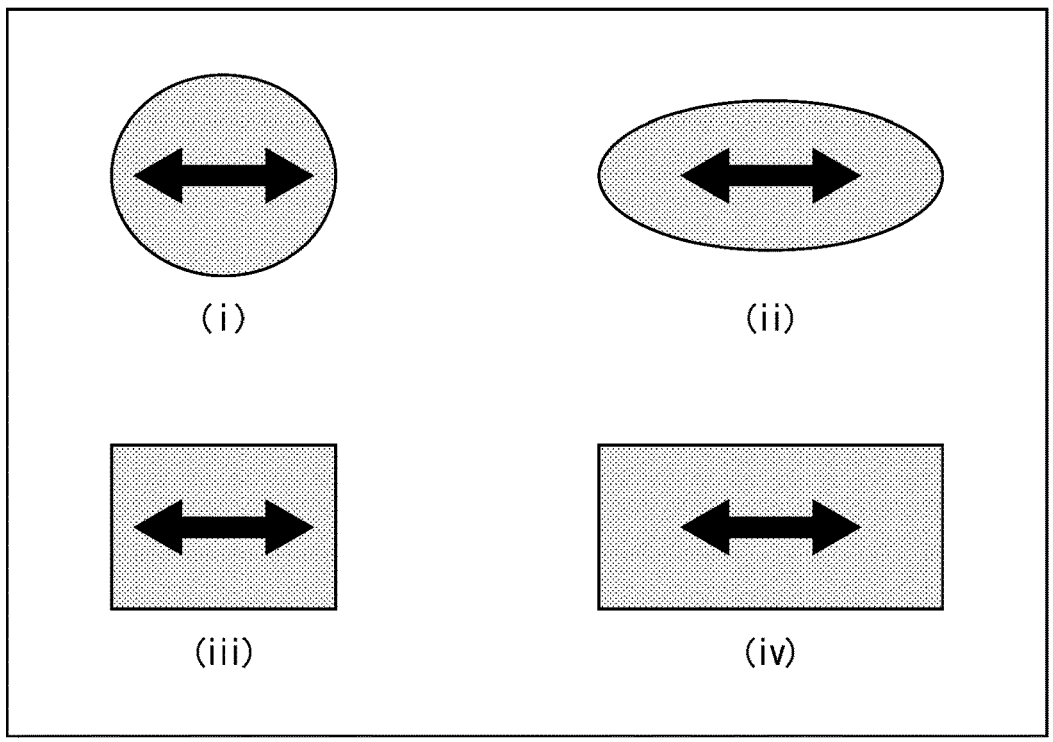
FIG. 3B is a schematic plan view of four examples of a laminate including a first ferromagnetic layer, a nonmagnetic layer, and a second ferromagnetic layer.

FIG. 3A is a schematic cross-sectional view of a magnetoresistance effect element according to a second embodiment of the present disclosure. FIG. 3B is a schematic plan view of four examples of a laminate including a first ferromagnetic layer, a nonmagnetic layer, and a second ferromagnetic layer. In FIG. 3B, each of the arrows indicates an example of a direction of an axis of easy magnetization.

Members using the same reference as those in the first embodiment have the same configuration, and description thereof will be omitted. Also, even if references are different from those in the first embodiment, description may be omitted for members having the same function.

A magnetoresistance effect element 20 includes a first ferromagnetic layer 11, a second ferromagnetic layer 12, and a nonmagnetic layer 13 sandwiched between the first ferromagnetic layer 11 and the second ferromagnetic layer 12 which are laminated in a first direction (z direction), and both the first ferromagnetic layer 11 and the second ferromagnetic layer 12 are formed such that a cross-sectional area of a cross section (cross section parallel to an xy plane) perpendicular to the first direction (z direction) increases as a distance from the nonmagnetic layer 13 increases in the first direction (z direction).

The first ferromagnetic layer 11 and the second ferromagnetic layer 12 illustrated in FIG. 3 are in-plane magnetic films whose magnetizations are oriented in an in-plane direction of the xy plane but may be perpendicular magnetization films whose magnetizations are oriented in the z-direction.

Both the first ferromagnetic layer 11 and the second ferromagnetic layer 12 are formed such that a cross-sectional area of the cross section perpendicular to the first direction (z direction) increases as a distance from the nonmagnetic layer 13 increases in the first direction (z direction).

Referring to FIG. 3, a configuration in which a cross section (cross section parallel to the xy plane) perpendicular to the first direction (z direction) is circular will be described as an example.

The first ferromagnetic layer 11 is formed such that a cross-sectional area of the cross section perpendicular to the z direction increases (for example, a diameter of the cross section of the first ferromagnetic layer 11 in contact with the nonmagnetic layer 13 is R2, whereas a diameter of the cross section of the first ferromagnetic layer 11 that is farthest from the nonmagnetic layer 13 is R1) as a distance from the nonmagnetic layer 13 increases in the z direction (toward a +z direction from the nonmagnetic layer 13). The first ferromagnetic layer 11 includes a same-diameter portion 11A which is a portion having the same diameter as the nonmagnetic layer 13 (an overlapping portion in a plan view from the z direction), and a circumferential end portion 11B which is a portion disposed on a side outward from the same-diameter portion 11A such that it does not overlap the nonmagnetic layer 13 in a plan view from the z direction.

Similarly, the second ferromagnetic layer 12 is formed such that a cross-sectional area of the cross section thereof perpendicular to the z direction increases (for example, a diameter of the cross section of the second ferromagnetic layer 12 in contact with the nonmagnetic layer 13 is R2, whereas a diameter of the cross section of the second ferromagnetic layer 12 that is farthest from the nonmagnetic layer 13 is R1) as a distance from the nonmagnetic layer 13 increases in the z direction (toward a −z direction from the nonmagnetic layer 13). The second ferromagnetic layer 12 includes a same-diameter portion 12A which is a portion having the same diameter as the nonmagnetic layer 13 (an overlapping portion in a plan view from the z direction), and a circumferential end portion 12B which is a portion disposed on a side outward from the same-diameter portion 12A such that it does not overlap the nonmagnetic layer 13 in a plan view from the z direction.

In the magnetoresistance effect element 20 illustrated in FIG. 3, the first ferromagnetic layer 11 and the second ferromagnetic layer 12 have a truncated cone shape, but the present disclosure is not limited thereto as long as they are formed such that a cross-sectional area of the cross section (cross section parallel to the xy plane) perpendicular to the z direction increases as a distance from the nonmagnetic layer 13 increases in the z direction.

For example, a lateral side surface 11a of the first ferromagnetic layer 11 may be formed such that an inclination becomes larger or an inclination becomes smaller as a distance from the nonmagnetic layer 13 increases in the z direction. Similarly, a lateral side surface 12a of the second ferromagnetic layer 12 may be formed such that an inclination becomes larger or an inclination becomes smaller as a distance from the nonmagnetic layer 13 increases in the z direction.

A lateral side surface 13a of the nonmagnetic layer 13 is preferably positioned on a center line $X_0$-$X_0$ side than the lateral side surfaces 11a and 12a of the first ferromagnetic layer 11 and the second ferromagnetic layer 12. That is, a distance between the lateral side surface 13a and the center line $X_0$-$X_0$ is preferably smaller than a distance between the lateral side surface 11a and the center line $X_0$-$X_0$ and a distance between the lateral side surface 12a and the center line $X_0$-$X_0$.

This is because, when the nonmagnetic layer 13 is retreated inward, since interface magnetic anisotropy derived from the nonmagnetic layer 13 cannot be utilized on the lateral side surfaces 11a and 12a of the first ferromagnetic layer 11 and the second ferromagnetic layer 12, anisotropy thereof changes and magnetization reversal becomes easy.

As in the magnetoresistance effect element 10 illustrated in FIG. 1A, portions (the circumferential end portion 11B and the circumferential end portion 12B) in which a distance between the first ferromagnetic layer 11 and the second ferromagnetic layer 12 is large is present also in the magnetoresistance effect element 20 illustrated in FIG. 3, a leakage magnetic field entering the first ferromagnetic layer from the second ferromagnetic layer can be reduced and improvement in the symmetry of magnetization reversal of the first ferromagnetic layer can be achieved.

Third Embodiment

Figure 4:
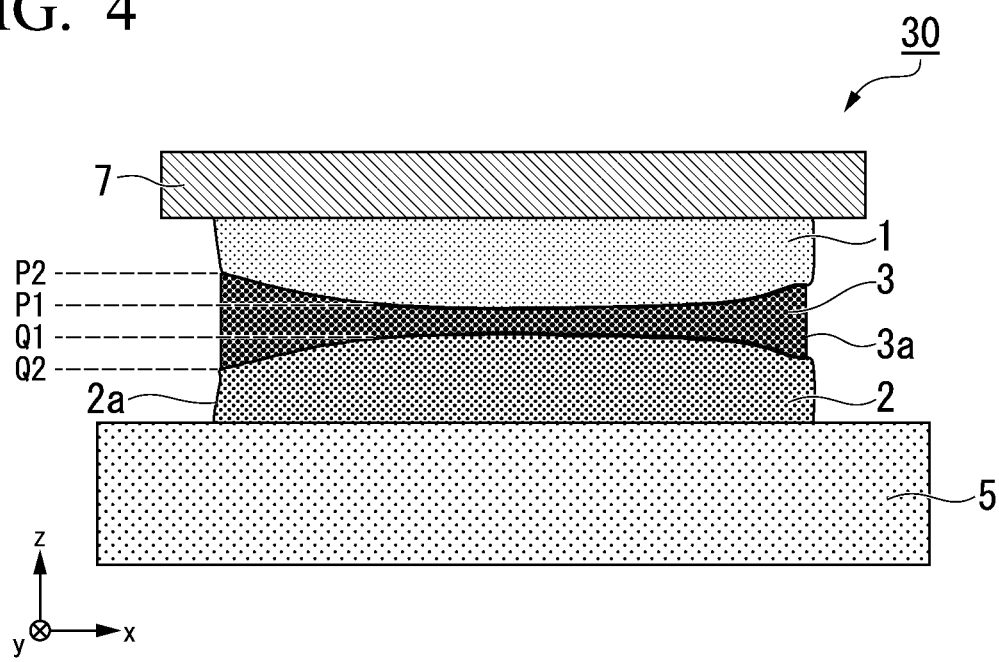
FIG. 4 is a schematic cross-sectional view of a magnetoresistance effect element according to a third embodiment of the present disclosure.

FIG. 4 is a schematic cross-sectional view of a magnetoresistance effect element according to a third embodiment of the present disclosure.

Members using the same reference as those in the first embodiment or the second embodiment have the same configuration, and description thereof will be omitted. Also, even if references are different from those in the first embodiment or the second embodiment, description may be omitted for members having the same function.

Compared to the magnetoresistance effect element 10 illustrated in FIG. 1, a magnetoresistance effect element 30 illustrated in FIG. 4 is different in that a spin-orbit torque wiring layer 7 is provided.

<Spin-Orbit Torque Wiring Layer>

The spin-orbit torque wiring layer 7 extends in an X direction. The spin-orbit torque wiring layer 7 is connected to one surface of the first ferromagnetic layer 1 facing a Z direction. The spin-orbit torque wiring layer 7 may be directly connected to the first ferromagnetic layer 1 or may be connected thereto via another layer.

It is preferable that a layer interposed between the spin-orbit torque wiring layer 7 and the first ferromagnetic layer 1 do not dissipate spin transferred from the spin-orbit torque wiring layer 7. For example, it is known that silver, copper, magnesium, aluminum, or the like has a long spin diffusion length of 100 nm or more and does not easily dissipate spin.

Also, a film thickness of this layer is preferably equal to or less than a spin diffusion length of a substance constituting the layer. When a film thickness of the layer is equal to or less than the spin diffusion length, spin transferred from the spin-orbit torque wiring layer 7 can be sufficiently transferred to the first ferromagnetic layer 1.

The spin-orbit torque wiring layer 7 is made of a material in which a spin current is generated by a spin Hall effect when a current flows therethrough. As such a material, any material may be sufficient as long as it has a configuration in which a spin current is generated in the spin-orbit torque wiring layer 7. Therefore, it is not limited to a material made of a single element, and a material made with a portion configured as a material from which a spin current is generated and a portion configured as a material from which a spin current is not generated may be used.

A phenomenon in which a first spin S1 and a second spin S2 are bent in opposite directions from each other in a direction perpendicular to a current direction and a spin current is induced on the basis of spin-orbit interaction when a current is caused to flow through a material is called a spin Hall effect. While a normal Hall effect and the spin Hall effect are the same in that a moving (traveling) direction of moving (traveling) charges (electrons) is bent, the normal Hall effect and the spin Hall effect greatly differ in that, in the normal Hall effect, charged particles moving in a magnetic field are subjected to a Lorentz force and a moving direction of the charged particles is bent, whereas in the spin Hall effect, a moving direction of charged particles is bent only due to moving electrons (only due to a flowing current) even though a magnetic field is absent.

Since the number of electrons of the first spin S1 is equal to the number of electrons of the second spin S2 in a nonmagnetic material (a material which is not a ferromagnetic material), the number of electrons of the first spin S1 directed to a direction toward a surface of the spin-orbit torque wiring layer 7 on which the first ferromagnetic layer 1 is disposed and the number of electrons of the second spin S2 directed to a direction opposite to the electrons of the first spin S1 are equal to each other. Therefore, a current corresponding to a net flow of charges is zero. A spin current without accompanying such a current is particularly referred to as a pure spin current.

Here, when a flow of electrons in the first spin S1 is expressed as $J_\uparrow$, a flow of electrons in the second spin S2 is expressed as $J_\downarrow$, and a spin current is expressed as $J_S$, $J_S=J_\uparrow-J_\downarrow$ is defined. The $J_S$ flows in one direction as the pure spin current. Here, the $J_S$ is a flow of electrons with a polarization of 100%.

The spin-orbit torque wiring layer 7 may contain a nonmagnetic heavy metal. Here, the term "heavy metal" is used to indicate a metal having a specific gravity equal to or higher than that of yttrium. The spin-orbit torque wiring layer 7 may be made of only a nonmagnetic heavy metal.

In this case, the nonmagnetic heavy metal is preferably a nonmagnetic metal having a high atomic number such as the atomic number of 39 or higher having d electrons or f electrons in the outermost shell. This is because such a nonmagnetic metal has a large spin-orbit interaction which causes the spin Hall effect. The spin-orbit torque wiring layer 7 may be formed of only a nonmagnetic metal having a high atomic number such as an atomic number of 39 or higher having d electrons or f electrons in the outermost shell.

Normally, when a current is caused to flow in a metal, all the electrons move in a direction opposite to the current regardless of an orientation of the spin, whereas, since a nonmagnetic metal with a high atomic number having d electrons and f electrons in the outermost shell has a large spin-orbit interaction, a movement direction of the electrons depends on an orientation of the spin of the electrons due to the spin Hall effect and thus a pure spin current $J_s$ tends to be generated.

Also, the spin-orbit torque wiring layer 7 may contain a magnetic metal. The term "magnetic metal" indicates a ferromagnetic metal or an antiferromagnetic metal. This is because, when a very small amount of a magnetic metal is contained in a nonmagnetic metal, a spin-orbit interaction is enhanced and spin current generation efficiency with respect to a current flowing through the spin-orbit torque wiring layer 7 can be increased. The spin-orbit torque wiring layer 7 may be made of only an antiferromagnetic metal.

Since the spin-orbit interaction is caused by an intrinsic internal field of a substance of the spin-orbit torque wiring material, a pure spin current is generated even in a nonmagnetic material. When a very small amount of a magnetic metal is added to the spin-orbit torque wiring material, the magnetic metal itself scatters spin of the electrons flowing therethrough and thus the spin current generation efficiency is enhanced. However, when an amount of the magnetic metal added is excessively increased, the generated spin current is scattered by the added magnetic metal, and as a result, an effect of decreasing the spin current enhances. Therefore, a molar ratio of the added magnetic metal is preferably sufficiently smaller than a molar ratio of a main component of a spin generation portion in the spin-orbit torque wiring. As a reference, the molar ratio of the added magnetic metal is preferably 3% or less.

Also, the spin-orbit torque wiring layer 7 may contain a topological insulator. The spin-orbit torque wiring layer 7 may be made of only a topological insulator. The topological insulator is a substance in which the interior of the material is an insulator or a high resistance body while a spin-polarized metal state is generated on its surface. In the substance, there is something like an internal magnetic field called a spin-orbit interaction. Therefore, a new topological phase develops due to an effect of the spin-orbit interaction even in a case in which there is no external magnetic field. This is the topological insulator and it can generate a pure spin current with high efficiency due to a strong spin-orbit interaction and breaking of inversion symmetry at an edge.

As the topological insulator, for example, SnTe, $Bi_{1.5}Sb_{0.5}Te_{1.7}Se_{1.3}$, $TlBiSe_2$, $Bi_2Te_3$, $Bi_{1-x}Sb_x$, $(Bi_{1-x}Sb_x)_2Te_3$, or the like is preferable. These topological insulators can generate a spin current with high efficiency.

Fourth Embodiment

Figure 5:
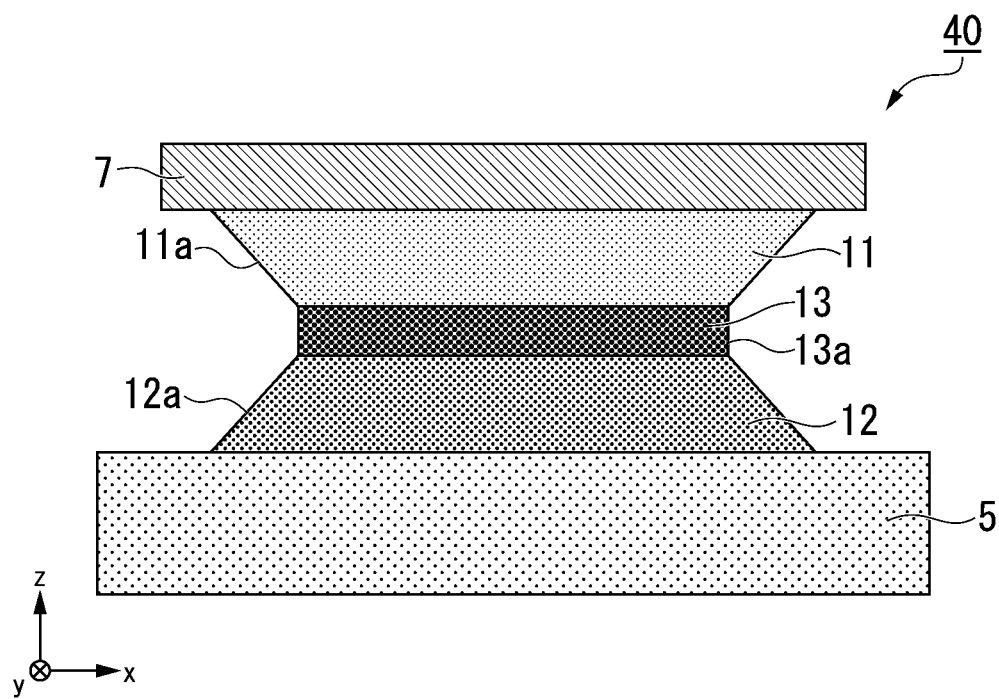
FIG. 5 is a schematic cross-sectional view of a magnetoresistance effect element according to a fourth embodiment of the present disclosure.

FIG. 5 is a schematic cross-sectional view of a magnetoresistance effect element according to a fourth embodiment of the present disclosure.

Members using the same reference as those in any of the first to third embodiments have the same configuration, and description thereof will be omitted. Also, even if references are different from those in any of the first to third embodiments, description may be omitted for members having the same function.

Compared to the magnetoresistance effect element 20 illustrated in FIG. 3, a magnetoresistance effect element 40 illustrated in FIG. 5 is different in that a spin-orbit torque wiring layer 7 is provided.

(Method of Manufacturing Magnetoresistance Effect Element)

The magnetoresistance effect element of the present disclosure can be manufactured using a known film deposition method.

Processing of the first ferromagnetic layer, the second ferromagnetic layer, and the nonmagnetic layer can be performed by a known method such as, for example, ion milling or reactive ion etching (RIE), or by an oxidation step or the like after the device processing.

The magnetoresistance effect element 10 illustrated in FIG. 1 can be manufactured by, for example, processing a curved magnetoresistance effect element into a columnar shape and then exposing it to oxygen so that oxygen is caused to enter the nonmagnetic layer from the lateral side wall to thicken the nonmagnetic layer in the thickness direction.

Also, in the magnetoresistance effect element 20 illustrated in FIG. 3, for example, ion milling may be made incident at an angle of less than 90 degrees with respect to the first direction (direction perpendicular to a surface thereof), and thereby an edge structure according to the incident angle can be made. However, since an upper layer thereof is also scraped, a material having a slow etching rate is capped on the upper layer, and thereby the magnetoresistance effect element 20 can be manufactured from a simple conical shape.

The magnetoresistance effect element 30 illustrated in FIG. 4 can be manufactured by, for example, applying chemical mechanical polishing (CMP) after forming the magnetoresistance effect element 10 illustrated in FIG. 1. Similarly, the magnetoresistance effect element 40 illustrated in FIG. 5 can be manufactured by, for example, applying CMP after forming the magnetoresistance effect element 20 illustrated in FIG. 3.

(Magnetic Memory)

A magnetic memory according to one embodiment of the present disclosure includes a plurality of spin-orbit torque magnetoresistance effect elements of the present disclosure.

Next, an application example of the magnetoresistance effect element according to the present embodiment or a modified example thereof will be described. The magnetoresistance effect element can be utilized in, for example, a magnetic sensor, a memory such as a magnetic random access memory (MRAM), or the like. Although an application example of the magnetoresistance effect element according to one embodiment is described, a magnetoresistance effect element according to another embodiment or a modified example thereof can also be similarly applied.

Figure 6:
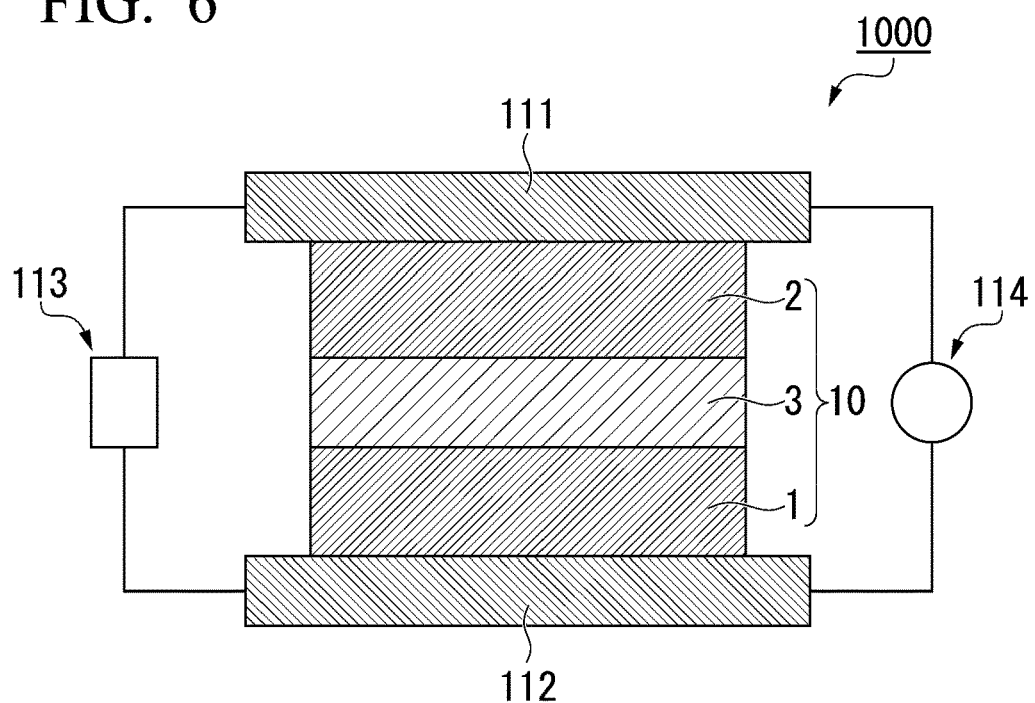
FIG. 6 is a schematic cross-sectional view of a magnetic recording element according to a first application example of the magnetoresistance effect element of the present disclosure.

FIG. 6 is a cross-sectional view of a magnetic recording element 1000 according to a first application example.

FIG. 6 is a cross-sectional view of a modified example of the magnetoresistance effect element 10 taken along a lamination direction of layers of the magnetoresistance effect element. The magnetic recording element 1000 illustrated in FIG. 6 is an example of application examples of the magnetoresistance effect element 10.

The magnetic recording element 1000 includes the magnetoresistance effect element 10, a first electrode 111, a second electrode 112, a power supply 113, and a measurement unit 114. The first electrode 111 is connected to a first surface of the magnetoresistance effect element 10 in the lamination direction. The second electrode 112 is connected to a second surface of the magnetoresistance effect element 10 in the lamination direction. The first electrode 111 and the second electrode 112 are conductors and may be, for example, Cu. The power supply 113 and the measurement unit 114 are respectively connected to the first electrode 111 and the second electrode 112. The power supply 113 applies a potential difference in the lamination direction of the magnetoresistance effect element 10. The measurement unit 114 measures a resistance value of the magnetoresistance effect element 10 in the lamination direction.

When a potential difference is generated between the first electrode 111 and the second electrode 112 by the power supply 113, a current flows in the lamination direction of the magnetoresistance effect element 10. The current is spin-polarized during passing through the second ferromagnetic layer 2 and becomes a spin-polarized current. The spin-polarized current reaches the first ferromagnetic layer 1 through a tunnel barrier layer 3. A magnetization of the first ferromagnetic layer 1 receives a spin transfer torque (STT) due to the spin-polarized current, and the magnetization is reversed. When a magnetization direction of the first ferromagnetic layer 1 and a magnetization direction of the second ferromagnetic layer 2 change, a resistance value of the magnetoresistance effect element 10 in the lamination direction changes. The resistance value of the magnetoresistance effect element 10 in the lamination direction is read by the measurement unit 114. That is, the magnetic recording element 1000 illustrated in FIG. 6 is a spin transfer torque (STT) type magnetic recording element.

Figure 7:
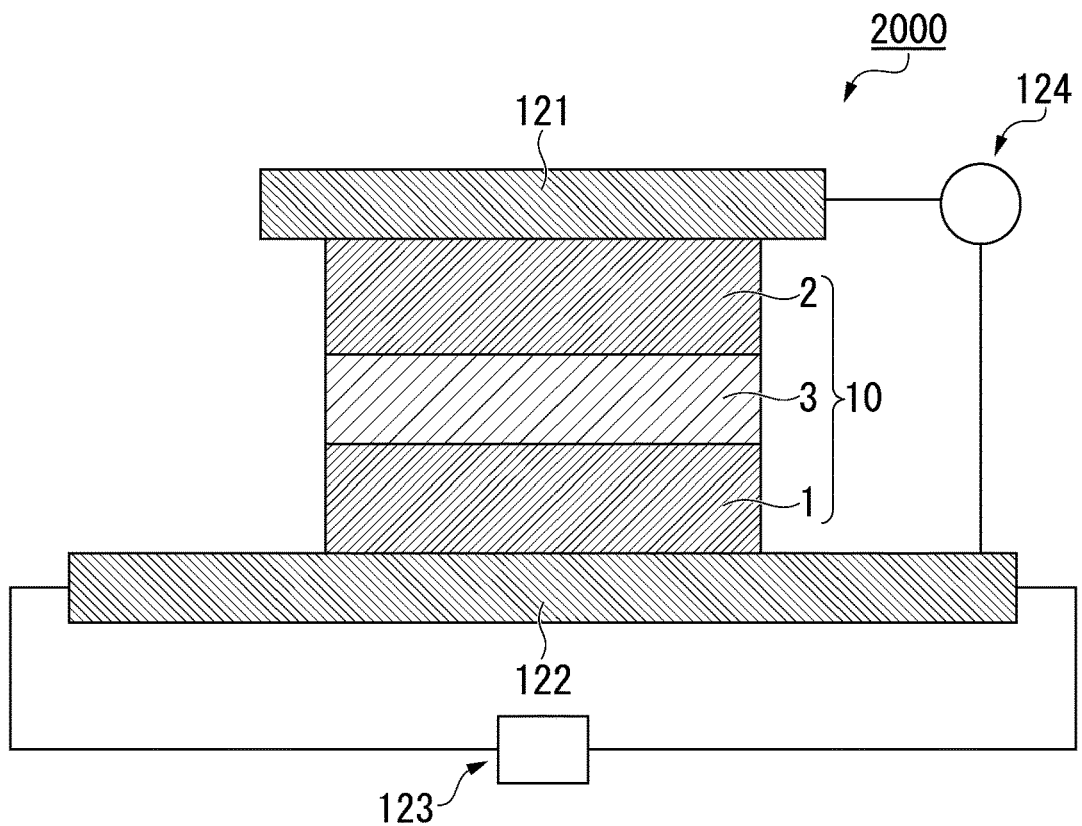
FIG. 7 is a schematic cross-sectional view of a magnetic recording element according to a second application example of the magnetoresistance effect element of the present disclosure.
Figure 8:
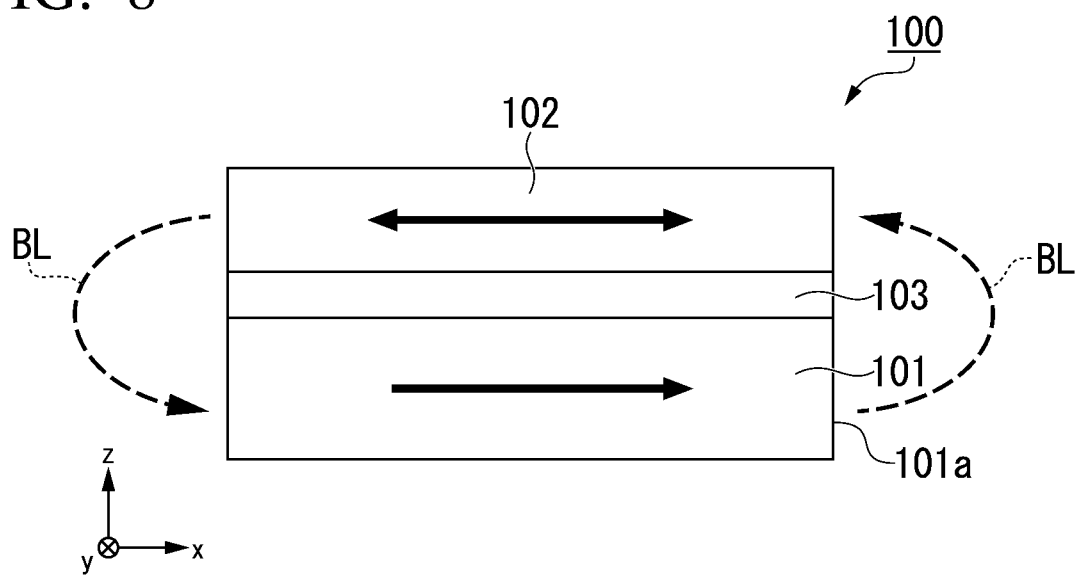
FIG. 8 is a schematic cross-sectional view of a conventional magnetoresistance effect element.

FIG. 7 is a cross-sectional view of a magnetic recording element 2000 according to a second application example. FIG. 7 is a cross-sectional view of the magnetoresistance effect element 10 taken along a lamination direction of layers of the magnetoresistance effect element. The magnetic recording element 2000 illustrated in FIG. 7 is an example of application examples of the magnetoresistance effect element 10.

The magnetic recording element 2000 includes the magnetoresistance effect element 10, a first electrode 121, a first wiring 122, a power supply 123, and a measurement unit 124. The first electrode 121 is connected to a first surface of the magnetoresistance effect element 10 in the lamination direction. The first wiring 122 is connected to a second surface of the magnetoresistance effect element 10 in the lamination direction. The first electrode 121 is a conductor and may be, for example, Cu. The first wiring 122 contains any one of a metal, an alloy, an intermetallic compound, a metal boride, a metal carbide, a metal silicide, and a metal phosphide which have a function of generating a spin current due to a spin Hall effect when a current flows therethrough. The first wiring 122 may be, for example, a nonmagnetic metal having an atomic number of 39 or higher having d electrons or f electrons in the outermost shell. The power supply 123 is connected to a first end and a second end of the first wiring 122. The measurement unit 124 is connected to the first electrode 121 and the first wiring 122 and measures a resistance value of the magnetoresistance effect element 10 in the lamination direction.

When a potential difference is generated between the first end and the second end of the first wiring 122 by the power supply 123, a current flows along the first wiring 122. When a current flows along the first wiring 122, a spin Hall effect occurs due to a spin-orbit interaction. The spin Hall effect is a phenomenon in which moving spins are bent in a direction perpendicular to a direction in which a current flows. The spin Hall effect produces an uneven distribution of spins in the first wiring 122 and induces a spin current in a thickness direction of the first wiring 122. The spins are injected into the first ferromagnetic layer 1 from the first wiring 122 by the spin current.

The spins injected into the first ferromagnetic layer 1 imparts a spin-orbit torque (SOT) to a magnetization of the first ferromagnetic layer 1. The first ferromagnetic layer 1 receives the spin orbit torque (SOT), and the magnetization is reversed. When a magnetization direction of the first ferromagnetic layer 1 and a magnetization direction of the second ferromagnetic layer 2 change, a resistance value of the magnetoresistance effect element 10 in the lamination direction changes. The resistance value of the magnetoresistance effect element 10 in the lamination direction is read by the measurement unit 124. That is, the magnetic recording element 2000 illustrated in HG. 7 is a spin-orbit torque (SOT) type magnetic recording element.

While preferred embodiments of the invention have been described and illustrated above, it should be understood that these are exemplary of the invention and are not to be considered as limiting. Additions, omissions, substitutions, and other modifications can be made without departing from the spirit or scope of the present disclosure. Accordingly, the invention is not to be considered as being limited by the foregoing description and is only limited by the scope of the appended claims.

EXPLANATION OF REFERENCES 1, 11 First ferromagnetic layer
2, 12 Second ferromagnetic layer
3 Nonmagnetic layer
7 Spin-orbit torque wiring layer
10, 20, 30, 40 Magnetoresistance effect element

What is claimed is:

1. A magnetoresistance effect element comprising:
a first ferromagnetic layer;
a second ferromagnetic layer; and
a nonmagnetic layer sandwiched between the first ferromagnetic layer and the second ferromagnetic layer which are laminated in a first direction, wherein
both the first ferromagnetic layer and the second ferromagnetic layer are curved so that central portions thereof protrude with respect to outer circumferential portions in the first direction, and protruding directions of the central portions are opposite to each other so that a distance between the outer circumferential portions of them is larger than a distance between the central portions of them in the first direction.

2. The magnetoresistance effect element according to claim 1, wherein a film thickness of the first ferromagnetic layer is smaller than a film thickness of the second ferromagnetic layer.

3. The magnetoresistance effect element according to claim 1, wherein the nonmagnetic layer includes a NaCl structure.

4. The magnetoresistance effect element according to claim 1, wherein the nonmagnetic layer includes a spinel structure or an inverse spinel structure.

5. The magnetoresistance effect element according to claim 1, further comprising a spin orbit torque wiring extending in the second direction intersecting the first direction and joined to the first ferromagnetic layer.

6. A magnetic memory comprising a plurality of magnetoresistance effect elements according to claim 1.

7. A magnetoresistance effect element comprising:
a first ferromagnetic layer whose magnetization direction is variable;
a second ferromagnetic layer whose magnetization direction is fixed, and
a nonmagnetic layer sandwiched between the first ferromagnetic layer and the second ferromagnetic layer which are laminated in a first direction, wherein
both the first ferromagnetic layer and the second ferromagnetic layer are formed so that a cross-sectional area of a cross section perpendicular to the first direction increases as a distance from the nonmagnetic layer increases in the first direction.

8. The magnetoresistance effect element according to claim 7, wherein an inclination of lateral side surfaces of the first ferromagnetic layer is configured to become larger as a distance from the nonmagnetic layer increase in the first direction.

9. The magnetoresistance effect element according to claim 7, wherein an inclination of lateral side surfaces of the first ferromagnetic layer is configured to become smaller as a distance from the nonmagnetic layer increase in the first direction.

10. The magnetoresistance effect element according to claim 7, wherein a film thickness of the first ferromagnetic layer is smaller than a film thickness of the second ferromagnetic layer.

11. The magnetoresistance effect element according to claim 7, wherein the nonmagnetic layer includes a NaCl structure.

12. The magnetoresistance effect element according to claim 7, wherein the nonmagnetic layer includes a spinel structure or an inverse spinel structure.

13. The magnetoresistance effect element according to claim 7, further comprising a spin orbit torque wiring extending in the second direction intersecting the first direction and joined to the first ferromagnetic layer.

14. A magnetic memory comprising a plurality of magnetoresistance effect elements according to claim 7.

* * * * *